United States Patent
Wu et al.

(10) Patent No.: US 8,550,824 B2
(45) Date of Patent: Oct. 8, 2013

(54) DISPLAY CARD ASSEMBLY

(75) Inventors: Kang Wu, Shenzhen (CN); Bo Tian, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 10 days.

(21) Appl. No.: 13/339,412

(22) Filed: Dec. 29, 2011

(65) Prior Publication Data

US 2013/0164952 A1 Jun. 27, 2013

(30) Foreign Application Priority Data

Dec. 23, 2011 (CN) .......................... 2011 1 0437295

(51) Int. Cl.
*H01R 12/00* (2006.01)
(52) U.S. Cl.
USPC .............................. 439/62; 361/753; 361/803
(58) Field of Classification Search
USPC .......................................................... 439/62
See application file for complete search history.

(56) References Cited

U.S. PATENT DOCUMENTS

| 8,097,933 | B2 * | 1/2012 | Suh ............................... 257/666 |
| 2010/0128447 | A1 * | 5/2010 | Macdougall et al. ......... 361/737 |
| 2011/0029708 | A1 * | 2/2011 | Chen et al. .................... 710/300 |
| 2013/0070410 | A1 * | 3/2013 | Chen et al. ............... 361/679.31 |
| 2013/0070411 | A1 * | 3/2013 | Liang et al. .............. 361/679.31 |
| 2013/0070412 | A1 * | 3/2013 | Ge et al. ................... 361/679.32 |
| 2013/0088843 | A1 * | 4/2013 | Cong et al. .................... 361/785 |

* cited by examiner

*Primary Examiner* — Renee Luebke
*Assistant Examiner* — Larisa Tsukerman
(74) *Attorney, Agent, or Firm* — Altis & Wispro Law Group, Inc.

(57) ABSTRACT

A display card assembly includes a display card with a first circuit board, a straight through connector, and an expansion card with a second circuit board. A first edge connector is arranged on a bottom edge of the first circuit board and includes first power pins connected to a control chip and first storage chips, first ground pins, and first signal pins. A second edge connector connected to the straight through connector is arranged on an end edge of the first circuit board adjoining the bottom edge and includes second power pins connected to the first power pins, second ground pins, and second signal pins connected to the control chip. A third edge connector engaged in the straight through connector is arranged on an end edge of the second circuit board and includes third power pins and third signal pins connected to the second storage chips, and third ground pins.

2 Claims, 2 Drawing Sheets

DISPLAY CARD ASSEMBLY

CROSS-REFERENCE OF RELATED APPLICATIONS

Relevant subject matter is disclosed in two co-pending U.S. patent applications with application Ser. No. 13/339,407 and application Ser. No. 13/339,409, filed on the same date, and having the same titles of "SERIAL ADVANCED TECHNOLOGY ATTACHMENT DUAL IN-LINE MEMORY MODULE ASSEMBLY", which are assigned to the same assignee as this patent application.

BACKGROUND

1. Technical Field

The present disclosure relates to a display card assembly.

2. Description of Related Art

As central processing units becomes more powerful to accommodate games with high resolution texturing and virtualization of operating systems, the graphics cards must have sufficient video memory to support the games and virtual machines. For cards without enough memory, users must replace the cards with larger memory which is expensive. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the drawings, is illustrated by way of example and not by way of limitation. References to "an" or "one" embodiment in this disclosure are not necessarily to the same embodiment, and such references mean at least one.

Figure 1:
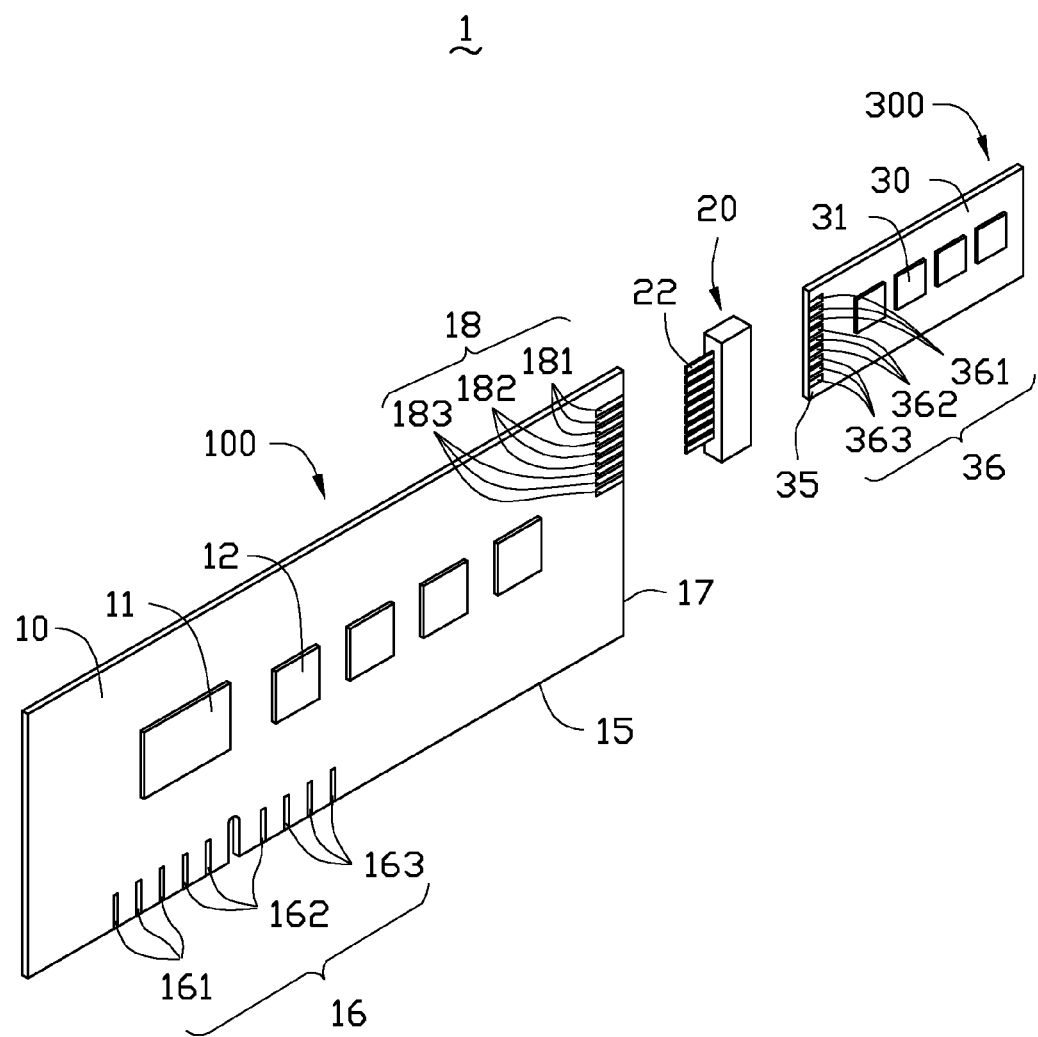
FIG. 1 is an exploded, isometric view of a display card assembly in accordance with an exemplary embodiment.
Figure 2:
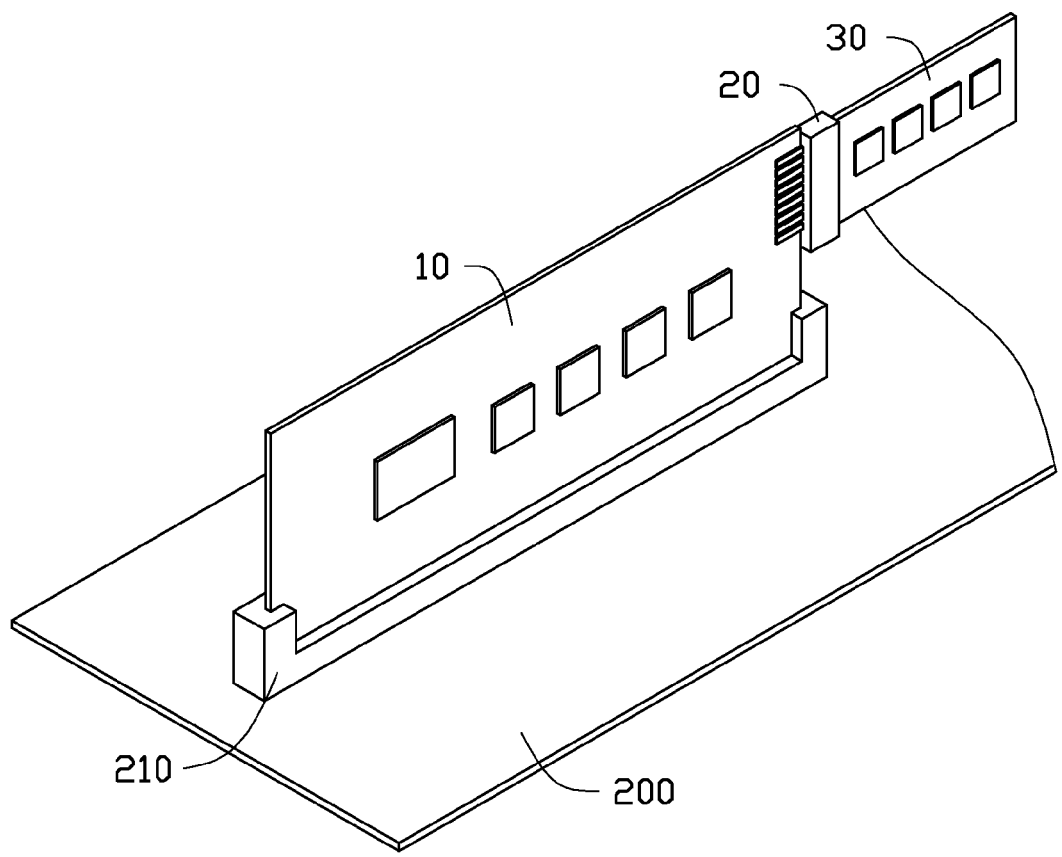
FIG. 2 is an assembled, isometric view of the display card assembly of FIG. 1 connected to a motherboard.

Referring to FIGS. 1 and 2, a display card assembly 1 in accordance with an exemplary embodiment includes a display card 100, an expansion card 300, and a connector 20.

The display card 100 includes a substantially rectangular circuit board 10. A control chip 11 and a plurality of storage chips 12 are all arranged on the circuit board 10. The control chip 11 is connected to the storage chips 12, to control the storage chips 12 to store data according to a received control signal. An edge connector 16 is arranged on a bottom edge 15 of the circuit board 10, to be inserted into an expansion slot, such as a peripheral component interconnection (PCI) slot 210, of a motherboard 200. The edge connector 16 includes a plurality of power pins 161, a plurality of ground pins 162, and a plurality of signal pins 163. The power pins 161 are connected to the control chip 11 and the storage chips 12. The ground pins 162 are connected to a ground layer (not shown) of the circuit board 10. The signal pins 163 are connected to the control chip 11.

An edge connector 18 is arranged on an end edge 17 of the circuit board 10 adjoining the bottom edge 15, to be electrically connected to pins 22 of the connector 20. The edge connector 18 includes a plurality of power pins 181, a plurality of ground pins 182, and a plurality of signal pins 183. The power pins 181 are connected to the power pins 161. The ground pins 182 are connected to the ground layer of the circuit board 10. The signal pins 183 are connected to the control chip 11. The edge connector 18 is arranged on an upper portion of the side edge 17 away from the bottom edge 15, to avoid interference between the connector 20 and PCI slot 210 when the edge connector 18 is connected to the connector 20.

The expansion card 300 includes a substantially rectangular circuit board 30. A plurality of storage chips 31 is arranged on the circuit board 30. An edge connector 36 is arranged on an end edge 35 of the circuit board 30, to be inserted into the connector 20. The edge connector 36 includes a plurality of power pins 361, a plurality of ground pins 362, and a plurality of signal pins 363. The power pins 361 and the signal pins 363 are connected to the storage chips 31. The ground pins 362 are connected to a ground layer (not shown) of the circuit board 30.

In assembly, the edge connector 16 is inserted into the PCI slot 210. When the motherboard 200 needs to add storage capacity of the display card 100, the edge connector 36 is inserted into the connector 20. The pins 22 are soldered on the circuit board 10, and are connected to the edge connector 18. The power pins 361, the ground pins 362, and the signal pins 363 are respectively connected to the power pins 181, the ground pins 182, and the signal pins 183 through the pins 22.

When the motherboard 200 receives power, the motherboard 200 outputs a voltage to the control chip 11 and the storage chips 12 through the PCI slot 210 and the power pins 161. At the same time, the voltage output from the motherboard 200 is provided to the storage chips 31 through the power pins 181, the connector 20, and the power pins 361. The motherboard 200 outputs a control signal, such as a PCI signal, to the control chip 11 through the PCI slot 210 and the signal pins 163. The control chip 11 controls the storage chips 12 to store data, and also controls the storage chips 31 to store data through the signal pins 183, the connector 20, and the signal pins 363.

The display card assembly 1 can add the storage capacity of the display card 100 through the expansion card 300, and the connector 20, to save cost.

Even though numerous characteristics and advantages of the disclosure have been set forth in the foregoing description, together with details of the structure and function of the disclosure, the disclosure is illustrative only, and changes may be made in detail, especially in matters of shape, size, and the arrangement of parts within the principles of the disclosure to the full extent indicated by the broad general meaning of the terms in which the appended claims are expressed.

What is claimed is:

1. A display card assembly, comprising:
   a straight through connector;
   a display card comprising:
      a first circuit board;
      a plurality of first storage chips arranged on the first circuit board;
      a control chip arranged on the first circuit board and connected to the first storage chips, to control the first storage chips to store data according to a received control signal;
      a first edge connector set on a bottom edge of the first circuit board to engage in an expansion slot of a motherboard, the first edge connector comprising a plurality of first power pins connected to the control chip and the first storage chips for transmitting voltages to the control chip and the first storage chips, a plurality of first ground pins, and a plurality of signal pins connected to the control chip; and a second edge connector arranged on an end of the first circuit board adjoining the bottom edge and electrically connected to the straight through connector, the second edge connector comprising a plurality of second power pins connected to the first power pins, a plurality of second ground pins, and a plurality of second signal pins connected to the control chip for receiving control signals from the control chip; and an expansion card comprising:

a second circuit board;

a plurality of second storage chips arranged on the second circuit board; and a third edge connector arranged on an end edge of the second circuit board to engage in the straight through connector, the third edge connector comprising a plurality of third power pins, a plurality of third ground pins, and a plurality of third signal pins, wherein the third power pins and the third signal pins are connected to the second storage chips for transmitting voltages and control signals to the second storage chips;

wherein when the motherboard receives power, the motherboard outputs voltages to the control chip and the first storage chips through the expansion slot and the first power pins, the voltage output from the motherboard is provided to the second storage chips through the second power pins, the straight through connector, and the third power pins, the motherboard outputs a control signal to the control chip through the expansion slot and the first signal pins, the control chip controls the first storage chips to store data, and also controls the second storage chips to store data through the second signal pins, the straight through connector, and the third signal pins.

2. The display card assembly of claim 1, wherein the second edge connector is soldered to the straight through connector.

* * * * *